(12) United States Patent
Lee

(10) Patent No.: US 11,217,312 B2
(45) Date of Patent: Jan. 4, 2022

(54) SEMICONDUCTOR DEVICE

(71) Applicant: SK hynix Inc., Icheon-si (KR)

(72) Inventor: Hee Youl Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/983,909

(22) Filed: Aug. 3, 2020

(65) Prior Publication Data

US 2021/0295924 A1    Sep. 23, 2021

(30) Foreign Application Priority Data

Mar. 19, 2020    (KR) .......................... 10-2020-0034035

(51) Int. Cl.
| | |
|---|---|
| *G11C 16/16* | (2006.01) |
| *G11C 16/24* | (2006.01) |
| *H01L 27/1157* | (2017.01) |
| *G11C 16/08* | (2006.01) |
| *G11C 16/26* | (2006.01) |

(52) U.S. Cl.
CPC .............. *G11C 16/16* (2013.01); *G11C 16/08* (2013.01); *G11C 16/24* (2013.01); *G11C 16/26* (2013.01); *H01L 27/1157* (2013.01)

(58) Field of Classification Search
CPC ......... G11C 16/16; G11C 16/24; G11C 16/26; G11C 16/08; H01L 27/1157
USPC ........................................ 365/185.11, 185.24
See application file for complete search history.

(56) References Cited

U.S. PATENT DOCUMENTS

| | | | | | |
|---|---|---|---|---|---|
| 6,717,861 | B2* | 4/2004 | Jeong | ...................... | G11C 16/10 |
| | | | | | 365/185.17 |
| 7,551,511 | B2* | 6/2009 | Lee | .................... | H01L 27/11517 |
| | | | | | 257/316 |
| 8,780,630 | B2* | 7/2014 | Park | ....................... | G11C 16/16 |
| | | | | | 365/185.11 |
| 9,530,467 | B1* | 12/2016 | Lee | ......................... | G11C 16/10 |
| 9,852,795 | B2* | 12/2017 | Kang | ................... | G11C 7/1063 |
| 11,031,080 | B1* | 6/2021 | Ogura Iwasaki | .... | G11C 15/046 |
| 2002/0186591 | A1* | 12/2002 | Lee | .......................... | G11C 7/18 |
| | | | | | 365/185.17 |
| 2005/0270882 | A1* | 12/2005 | Han | ....................... | G11C 16/12 |
| | | | | | 365/227 |
| 2006/0291289 | A1* | 12/2006 | Lee | .................... | G11C 16/3454 |
| | | | | | 365/185.22 |
| 2009/0067257 | A1* | 3/2009 | Lee | ....................... | G11C 16/349 |
| | | | | | 365/185.33 |

(Continued)

FOREIGN PATENT DOCUMENTS

| | | | |
|---|---|---|---|
| KR | 1020150002001 A | 1/2015 | |
| KR | 1020160095557 A | 8/2016 | |

*Primary Examiner* — Michael T Tran
(74) *Attorney, Agent, or Firm* — William Park & Associates Ltd.

(57) ABSTRACT

A semiconductor device includes a first memory block including a first memory string, a second memory block including a second memory string, a common source line commonly coupled to the first memory block and the second memory block, a first bit line coupled to the first memory string, a second bit line coupled to the second memory string, a first page buffer for accessing the first memory string through the first bit line, and a second page buffer for accessing the second memory string through the second bit line. The first bit line and the first page buffer are electrically connected to each other when the first memory block is selected.

18 Claims, 14 Drawing Sheets

(56) References Cited

U.S. PATENT DOCUMENTS

| | | | |
|---|---|---|---|
| 2010/0046290 A1* | 2/2010 | Park | G11C 16/0483 365/185.2 |
| 2012/0081961 A1* | 4/2012 | Yoon | G11C 16/3459 365/185.12 |
| 2012/0099390 A1* | 4/2012 | Cho | G11C 7/1048 365/203 |
| 2014/0344505 A1* | 11/2014 | Lim | G06F 12/0246 711/103 |
| 2016/0163386 A1* | 6/2016 | Hwang | G11C 5/025 365/185.12 |
| 2019/0259430 A1* | 8/2019 | Lee | G11C 7/1048 |
| 2020/0168277 A1* | 5/2020 | Kim | G11C 16/0483 |
| 2021/0065800 A1* | 3/2021 | Oh | G11C 16/0483 |
| 2021/0066143 A1* | 3/2021 | Jung | G11C 29/46 |
| 2021/0151085 A1* | 5/2021 | Kim | G06F 1/12 |

* cited by examiner

FIG. 9
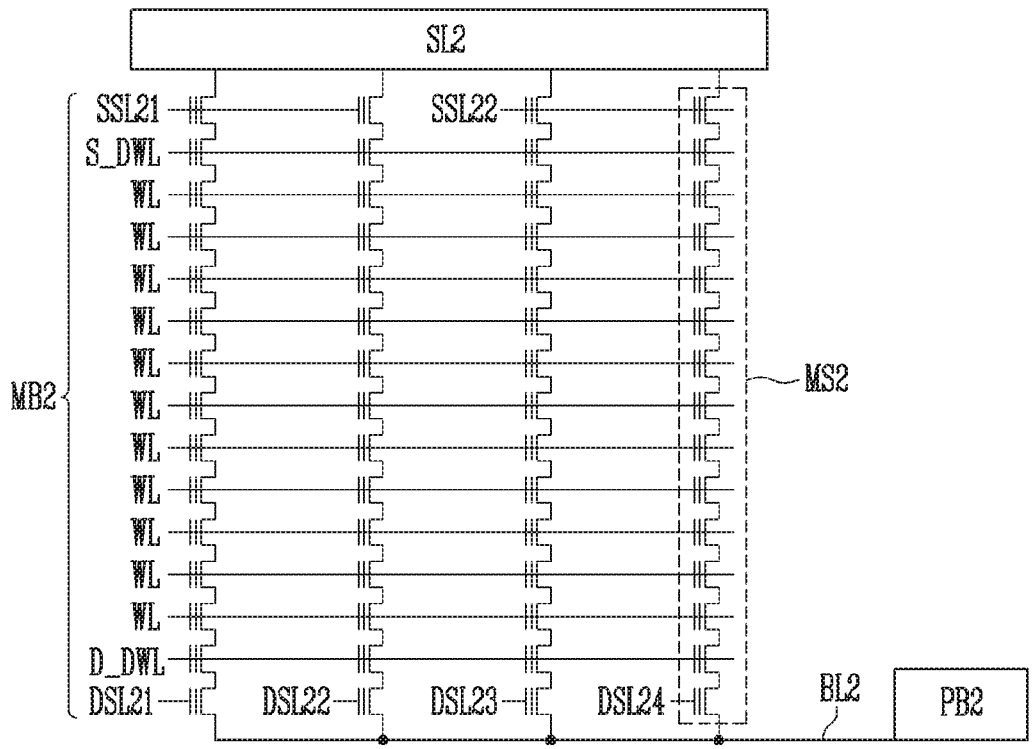
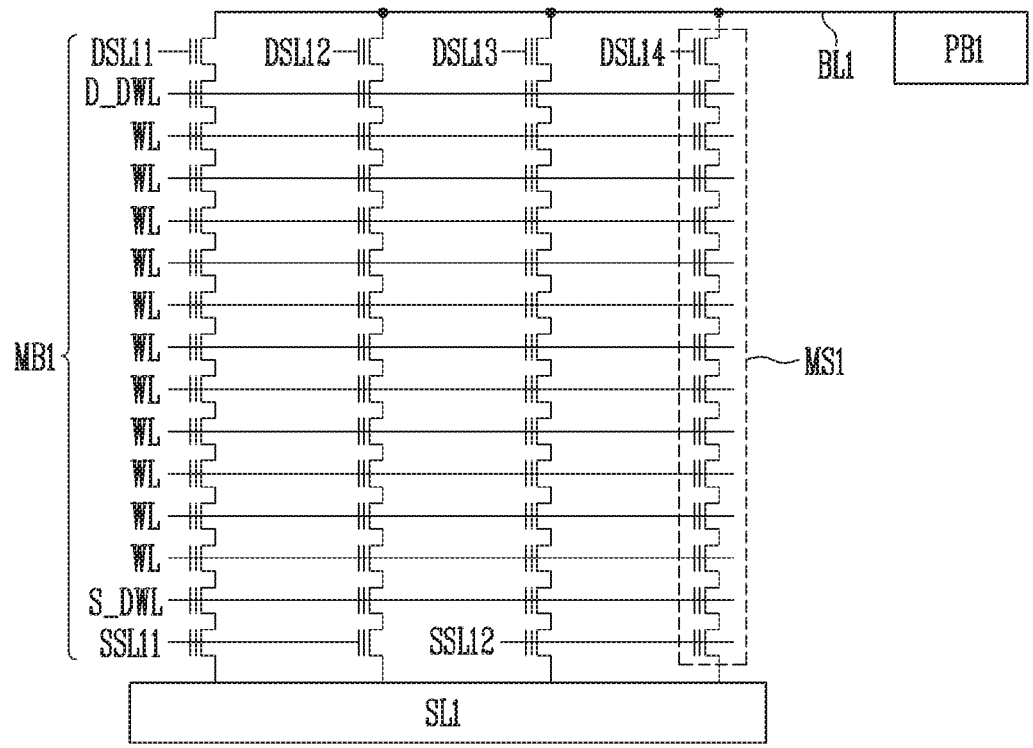

SEMICONDUCTOR DEVICE

CROSS-REFERENCE TO RELATED APPLICATION

The present application claims priority under 35 U.S.C. § 119(a) to Korean patent application number 10-2020-0034035 filed on Mar. 19, 2020, in the Korean Intellectual Property Office, the entire disclosure of which is incorporated herein by reference.

BACKGROUND

1. Technical Field

Various embodiments relate generally to an electronic device, and more particularly, to a semiconductor device.

2. Related Art

A semiconductor device may include a memory device that stores data or outputs the stored data. The memory device may include volatile memory that loses data in the absence of supplied power. Examples of volatile memory include static random access memory (SRAM), dynamic RAM (DRAM), synchronous DRAM (SDRAM), and the like. However, the memory device may include non-volatile memory that retains data in the absence of supplied power. Examples of non-volatile memory include read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), ferroelectric RAM (FRAM), and the like.

A memory device may include: a memory cell array for storing data; a peripheral circuit for performing various operations, such as program, read, and erase operations; and control logic for controlling the peripheral circuit. The memory device may include memory cells that are two-dimensionally or three-dimensionally arranged over a substrate.

SUMMARY

Various embodiments of the present disclosure are directed to a semiconductor device having improved operating characteristics.

According to an embodiment, a semiconductor device may include a first memory block including a first memory string, a second memory block including a second memory string, a common source line commonly coupled to the first memory block and the second memory block, a first bit line coupled to the first memory string, a second bit line coupled to the second memory string, a first page buffer for accessing the first memory string through the first bit line, and a second page buffer for accessing the second memory string through the second bit line. The first bit line and the first page buffer are electrically connected to each other when the first memory block is selected.

According to an embodiment, a semiconductor device may include: a first memory block including a first memory string including a first drain select transistor; a second memory block including a second memory string including a second drain select transistor; a common source line commonly coupled to the first memory block and the second memory block; a first bit line, wherein a connection between the first bit line and the first memory string is controlled by the first drain select transistor; a second bit line, wherein a connection between the second bit line and the second memory string is controlled by the second drain select transistor, and a common page buffer for accessing the first memory string through the first bit line, or the second memory string through the second bit line. The common page buffer accesses the first memory string through the first bit line and does not access the second memory string when the first memory block is selected.

According to an embodiment, a semiconductor device may include a first memory block including a first memory string, a second memory block including a second memory string, a first source line coupled to the first memory block, a second source line coupled to the second memory block, a first bit line located between the first memory block and the second memory block and coupled to the first memory string, a second bit line located between the first memory block and the second memory block and coupled to the second memory string, a first page buffer for accessing the first memory string through the first bit line, and a second page buffer for accessing the second memory string through the second bit line. When the first memory block is selected, the first bit line is electrically connected to the first page buffer and the second bit line is electrically disconnected from the second page buffer.

According to an embodiment, a semiconductor device may include: a first memory block including a first memory string including a first drain select transistor; a second memory block including a second memory string including a second drain select transistor; a first source line coupled to the first memory block; a second source line coupled to the second memory block; a first bit line located between the first memory block and the second memory block, wherein a connection between the first bit line and the first memory string is controlled by the first drain select transistor; a second bit line located between the first memory block and the second memory block, wherein a connection between the second bit line and the second memory string is controlled by the second drain select transistor; and a common page buffer for accessing the first memory string through the first bit line, or the second memory string through the second bit line. The common page buffer accesses the first memory string through the first bit line and does not access the second memory string when the first memory block is selected.

BRIEF DESCRIPTION OF THE DRAWINGS

FIG. 9 is a diagram illustrating a method of operating a semiconductor device according to an embodiment of the present disclosure.

DETAILED DESCRIPTION

Specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

Figure 1:
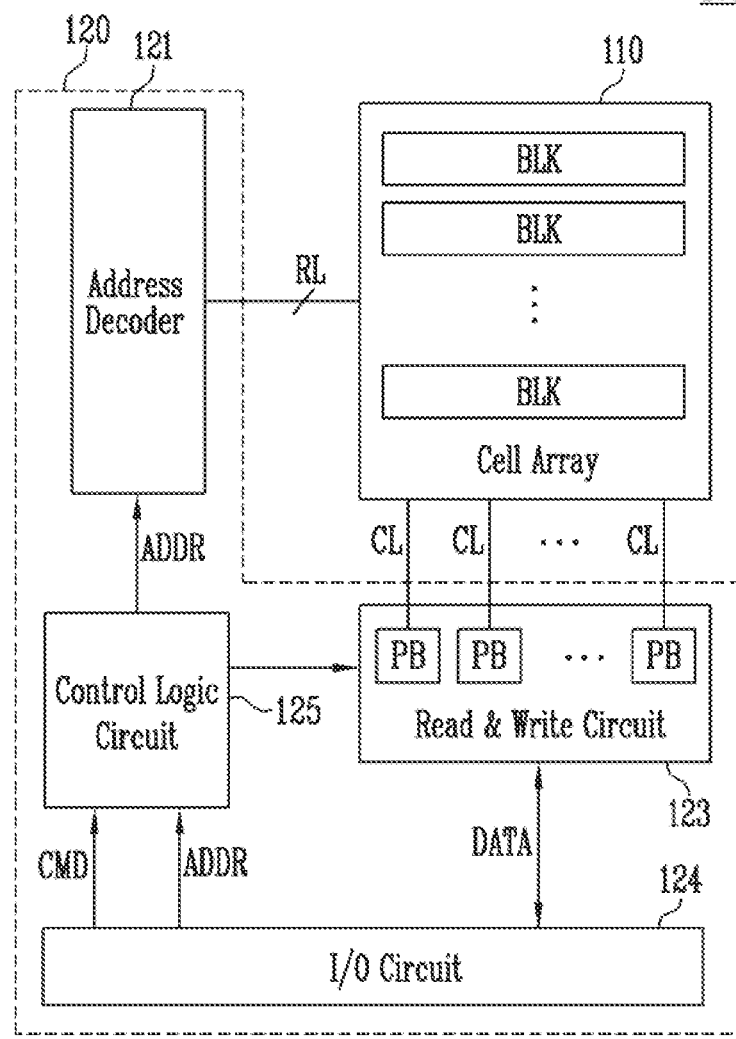
FIG. 1 is a block diagram illustrating a configuration of a semiconductor device according to an embodiment of the present disclosure.

FIG. 1 is a block diagram illustrating the configuration of a semiconductor device 100 according to an embodiment of the present disclosure.

Referring to FIG. 1, the semiconductor device 100 may include a cell array 110 and a peripheral circuit 120. The peripheral circuit 120 may include an address decoder 121, a read and write circuit 123, an input/output circuit 124, and control logic circuit 125. The semiconductor device 100 may be a memory device, which may be a volatile memory device or a non-volatile memory device. For example, the semiconductor device 100 may be a flash memory device.

The cell array 110 may be coupled to an address decoder 121 through row lines RL and to a read and write circuit 123 through column lines CL. The row lines RL may be word lines and the column lines CL may be bit lines. However, the word lines and the bit lines may be relative to each other. In other words, the row lines may be bit lines and the column lines may be word lines.

The cell array 110 may include a plurality of memory strings, and the plurality of memory strings may be arranged in a horizontal direction or a vertical direction to a substrate. In addition, the cell array 110 may include a plurality of memory blocks BLK. The memory blocks BLK may be arranged in a horizontal direction or a vertical direction. Each of the memory blocks BLK may include a plurality of pages.

The control logic circuit 125 may be coupled to the address decoder 121, the read and write circuit 123, and the input/output circuit 124. The control logic circuit 125 may receive a command CMD and an address ADDR from the input/output circuit 124 and control the address decoder 121 and the read and write circuit 123 to perform an internal operation in response to the received command CMD. The control logic circuit 125 may be implemented as hardware, software, or a combination of hardware and software. For example, the control logic circuit 125 may be a circuit operating in accordance with an algorithm and/or a processor executing control logic code.

The address decoder 121 may be coupled to the cell array 110. For example, the address decoder 121 may be coupled to the cell array 110 through a word line, a dummy word line, a source select line, and a drain select line. In addition, the address decoder 121 may control the row lines RL in response to the control logic circuit 125. Therefore, the address decoder 121 may receive the address ADDR from the control logic circuit 125 and select one of the memory blocks of the cell array 110 in response to the received address ADDR.

A program operation and a read operation of the semiconductor device 100 may be performed in units of pages. Therefore, during a program operation and a read operation, the address ADDR may include a block address and a row address. The address decoder 121 may decode the block address included in the received address ADDR and select one of the memory blocks according to the decoded block address. The address decoder 121 may decode the row address included in the received address ADDR and select one of the memory blocks according to the decoded row address.

An erase operation of the memory device 100 may be performed in units of memory blocks. Therefore, during an erase operation, the address ADDR may include a block address.

The address decoder 121 may decode the block address and select one of the memory blocks according to the decoded block address.

The read and write circuit 123 may be coupled to the cell array 110 through the column lines CL. The read and write circuit 123 may include page buffers PB. The page buffers PB may be coupled to the cell array 110 through the column lines CL.

During a program operation, the read and write circuit 123 may transfer data DATA received from the input/output circuit 124 to the column lines CL, and memory cells of a selected page may be programmed in response to the transferred data DATA. The data DATA may be multi-bit data to be programmed into each of the memory cells. During a read operation, the read and write circuit 123 may read the data DATA from the memory cells of the selected page through the column lines CL and output the read data DATA to the input/output circuit 124. During an erase operation, the read and write circuit 123 may float the column lines CL. The program operation and the erase operation may include a verify operation. The verify operation may be performed in a similar manner to the read operation.

According to the above-described configuration, the control logic circuit 125 may control the semiconductor device 100 to select a memory block BLK to perform program, read, and erase operations on, among the stacked memory blocks BLK, and electrically connect only the selected memory block BLK to a page buffer PB. The control logic circuit 125 may control the semiconductor device 100 to electrically connect the column line CL of the selected memory block BLK to the page buffer PB, and to disconnect the unselected memory block BLK from the page buffer PB. As a result, the block size may be reduced and cell performance characteristics may be ensured.

Figure 2:
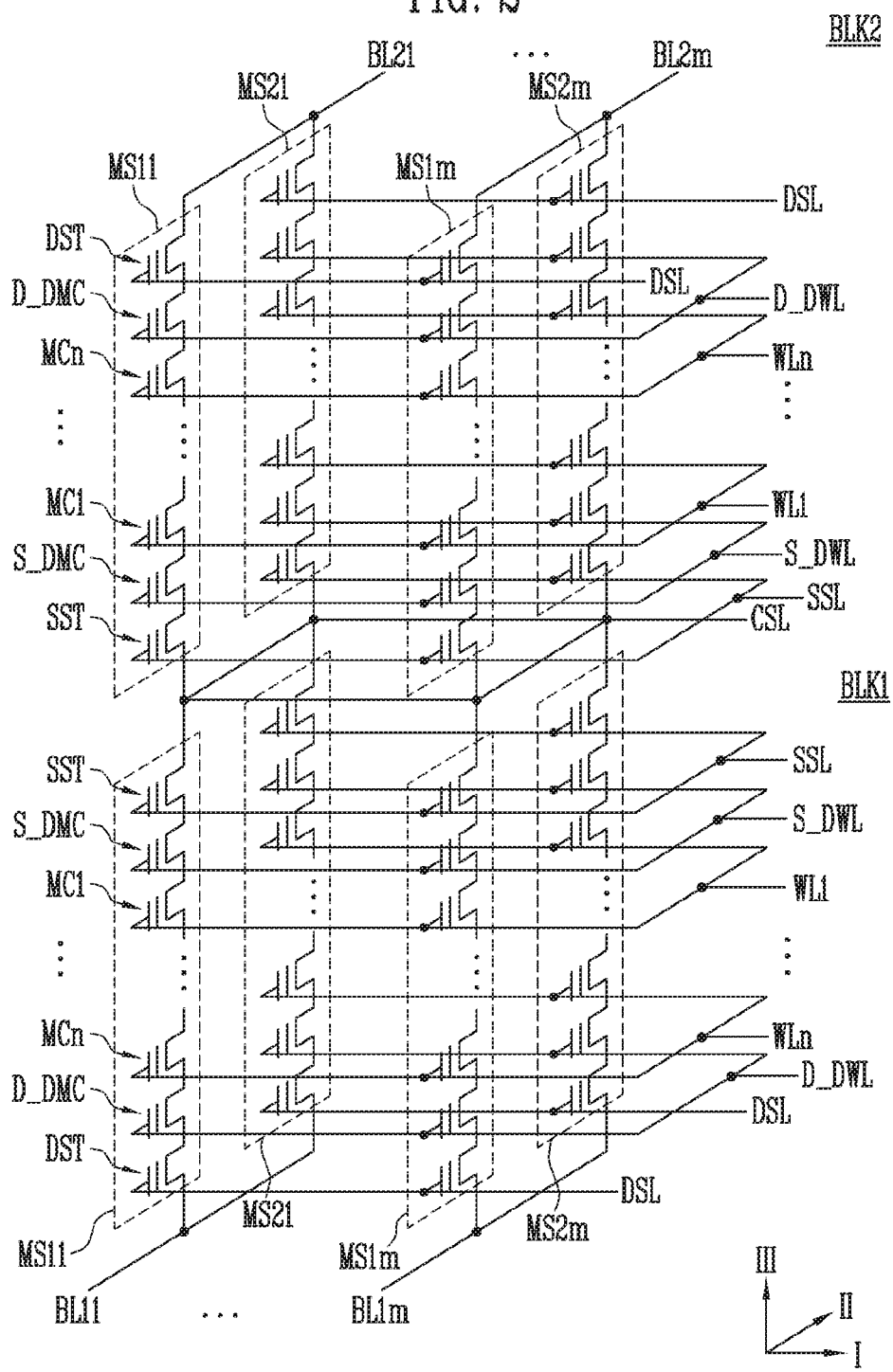
FIGS. 2 and 3 are circuit diagrams illustrating a cell array structure of a semiconductor device according to an embodiment of the present disclosure.
Figure 3:
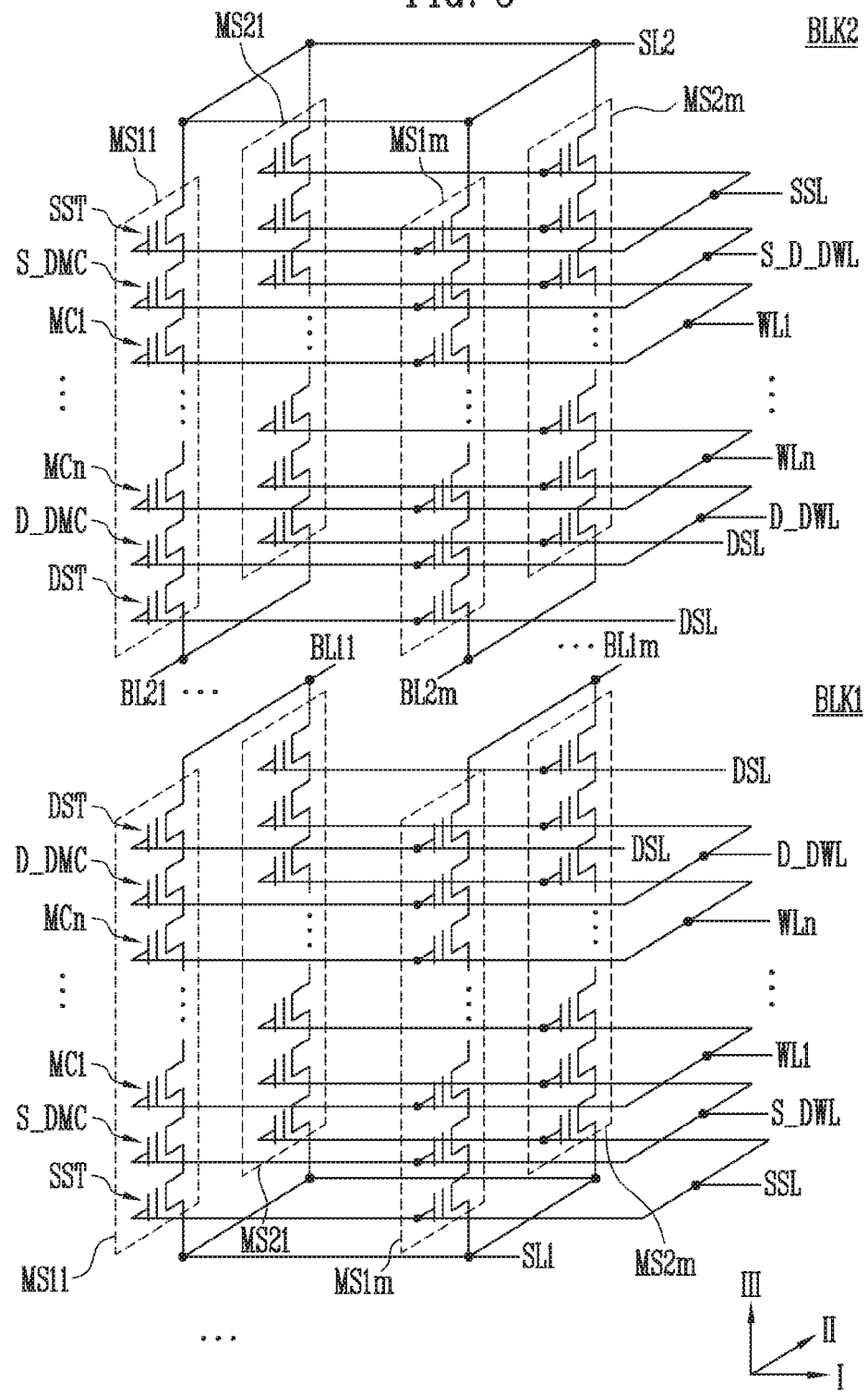

FIGS. 2 and 3 are circuit diagrams illustrating a cell array structure of the semiconductor device 100 according to an embodiment of the present disclosure.

Referring to FIG. 2, a cell array may include a plurality of memory blocks BLK1 and BLK2. The memory blocks BLK1 and BLK2 may be stacked in a third direction III. Each of the memory blocks BLK1 and BLK2 may include a plurality of memory strings MS11 to MS1m and MS21 to MS2m. The memory strings MS11 to MS1m and MS21 to MS2m may extend in the third direction III. Memory cells MC1 to MCn may be stacked in the third direction III. In FIG. 2, 'm' is an integer of 2 or more.

The first memory block BLK1 may include the memory strings MS11 to MS1m and MS21 to MS2m coupled between bit lines BL11 to BL1m and a common source line CSL. The memory strings MS11 to MS1m and MS21 to MS2m arranged in a second direction II may share the bit lines BL11 to BL1m. The second direction II may cross the third direction III.

The second memory block BLK2 may include the memory strings MS11 to MS1m and MS21 to MS2m coupled between bit lines BL21 to BL2m and the common source line CSL. The memory strings MS11 to MS1m and MS21 to MS2m arranged in the second direction II may share the bit lines BL21 to BL2m.

Each of the memory strings MS11 to MS1m and MS21 to MS2m may include at least one source select transistor SST, the first to nth memory cells MC1 to MCn and at least one drain select transistor DST. In FIG. 2, 'n' is an integer of 2 or more.

Each of the memory strings MS11 to MS1m and MS21 to MS2m may further include at least one source side dummy memory cell S_DMC coupled between the source select transistor SST and the memory cell MC1. Each of the memory strings MS11 to MS1m and MS21 to MS2m may further include at least one drain side dummy memory cell D_DMC coupled between the drain select transistor DST and the memory cell MCn.

At least one source select transistor SST included in one memory string (MS11 to MS1m and MS21 to MS2m) may be coupled in series between the memory cell MC1 and the common source line CSL. Gate electrodes of the source select transistors SST may be coupled to a source select line SSL. The source select transistors SST at the same level may be coupled to the same source select line SSL. Alternatively, the source select transistors SST at the same level, among the source select transistors SST of the memory strings MS11 to MS1m and MS21 to MS2m arranged in the same row (first direction I), may be coupled to the same source select line SSL, and the source select transistors SST arranged in different rows may be coupled to different source select lines SSL.

The memory cells MC1 to MCn included in one of the memory strings MS11 to MS1m and MS21 to MS2m may be coupled in series between the source select transistor SST and the drain select transistor DST. Gate electrodes of the memory cells MC1 to MCn may be coupled to word lines WL1 to WLn, and the memory cells MC1 to MCn at the same level may be coupled to the same word line (WL1 to WLn). Word line voltages (program bias, pre-program bias and read bias) necessary for driving may be applied to each of the word lines WL1 to WLn.

At least one drain select transistor DST included in one of the memory strings MS11 to MS1m and MS21 to MS2m may be coupled in series between the bit line (BL11 to BL1m, or BL21 to BL2m) and the memory cell MCn. Gate electrodes of the drain select transistors DST may be coupled to a drain select line DSL. The drain select transistors DST at the same level, among the drain select transistors DST of the memory strings MS11 to MS1m and MS21 to MS2m arranged in the same row (direction I), may be coupled to the same drain select line DSL. In addition, the drain select transistors DST arranged in another row (direction I) may be coupled to different drain select lines DSL.

At least one source side dummy memory cell S_DMC included in one of the memory strings MS11 to MS1m and MS21 to MS2m may be coupled in series between the source select transistor SST and the memory cell MC1. A gate electrode of the source side dummy memory cell S_DMC may be coupled to source side dummy word lines S_DWL. The source side dummy memory cells S_DMC at the same level may be coupled to the same source side dummy word line S_DWL. Word line voltages (program voltage, pass voltage and read voltage) necessary for driving may be applied to the source side dummy word line S_DWL.

At least one drain side dummy memory cell D_DMC included in one of the memory strings MS11 to MS1m and MS21 to MS2m may be coupled in series between the drain select transistor DST and the memory cell MCn. A gate electrode of the drain side dummy memory cell D_DMC may be coupled to drain side dummy word lines D_DWL. The drain side dummy memory cells D_DMC at the same level may be coupled to the same drain side dummy word line D_DWL. Word line voltages (program voltage, pass voltage, and read voltage) necessary for driving may be applied to the drain side dummy word line D_DWL.

The first memory block BLK1 and the second memory block BLK2 may be stacked in the third direction III. The first memory block BLK1 may be located above the second memory block BLK2, or the second memory block BLK2 may be located above the first memory block BLK1. The first memory block BLK1 and the second memory block BLK2 may share the common source line CSL. The memory strings MS11 to MS1m and MS21 to MS2m included in the first memory block BLK1 and the memory strings MS11 to MS1m and MS21 to MS2m included in the second memory block BLK2 may be arranged in mirror type on the basis of the common source line CSL. The bit lines BL11 to BL1m included in the first memory block BLK1 may be electrically insulated from the bit lines BL21 to BL2m included in the second memory block BLK2, and may be driven independently of each other.

Referring to FIG. 3, the first memory block BLK1 may include the memory strings MS11 to MS1m and MS21 to MS2m coupled between a first source line SL1 and the bit lines BL11 to BL1m. The second memory block BLK2 may include the memory strings MS11 to MS1m and MS21 to MS2m coupled between a second source line SL2 and the bit lines BL21 to BL2m. The memory strings MS11 to MS1m and MS21 to MS2m included in the first memory block BLK1 and the memory strings MS11 to MS1m and MS21 to MS2m included in the second memory block BLK2 may be arranged in mirror type on the basis of the bit lines BL11 to BL1m and BL21 to BL2m. Because the other parts of the structures are similar to those described above with reference to FIG. 2, repeated descriptions thereof will be omitted.

Figure 4:
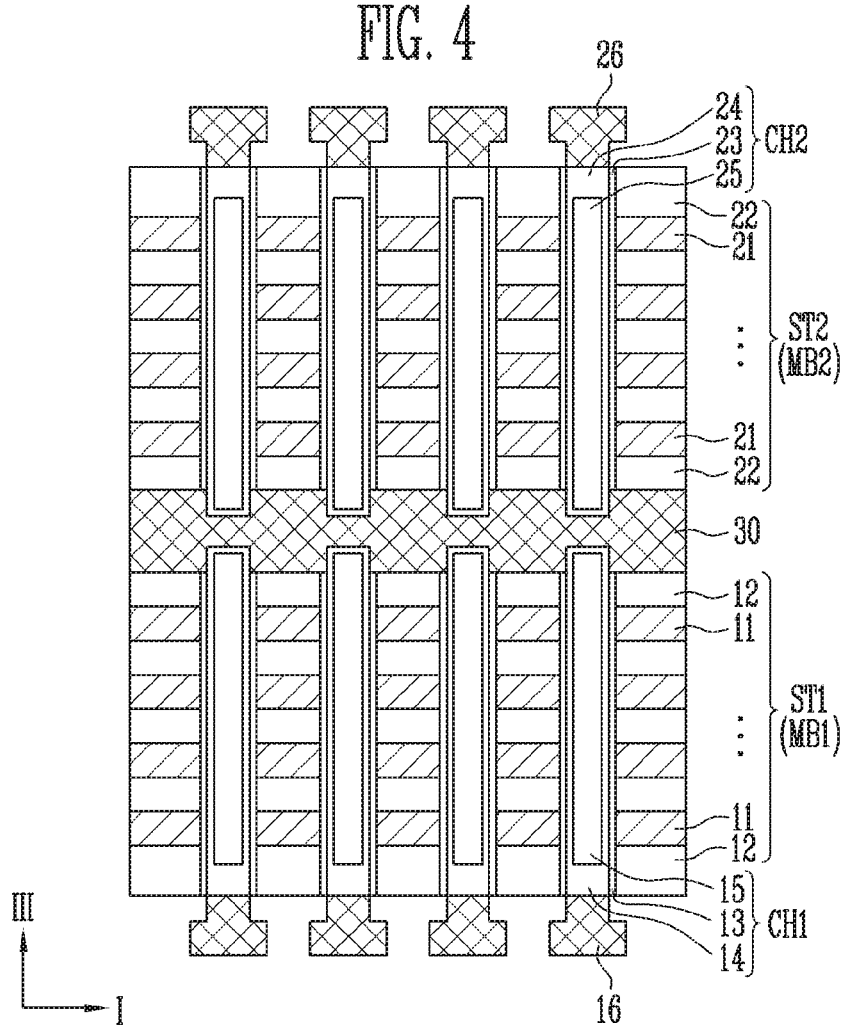
FIG. 4 is a diagram illustrating a configuration of a semiconductor device according to an embodiment of the present disclosure.

FIG. 4 is a diagram illustrating the configuration of a semiconductor device according to an embodiment of the present disclosure.

Referring to FIG. 4, the semiconductor device may include a first stacked structure ST1, a second stacked structure ST2, a common source line 30, first bit lines 16, and second bit lines 26. The first stacked structure ST1 may belong to a first memory block MB1 and the second stacked structure ST1 may belong to a second memory block MB2. The first stacked structure ST1 and the second stacked structure ST2 may be stacked in the third direction III.

The first stacked structure ST1 may include first conductive layers 11 and first insulating layers 12 stacked alternately with each other. Each of the first conductive layers 11 may be a gate electrode of a select transistor, a memory cell, or a dummy transistor. The first conductive layers 11 may include a conductive material such as polysilicon, tungsten, and metal. The first insulating layers 12 may be formed to insulate the stacked first conductive layers 11 from each other. The first insulating layers 12 may include an insulating material such as oxides and nitrides. The first conductive layers 11 may include at least one source select line, word lines, and at least one drain select line. The first conductive layers 11 may further include at least one drain side dummy word line or at least one source side dummy word line.

A first channel structure CH1 may pass through the first stacked structure ST1 and extend in the third direction III. The first channel structures CH1 may be coupled to the first bit lines 16. Select transistors, memory cells, or dummy memory cells may be located at intersections between the first channel structure CH1 and the first conductive layers 11. The first channel structure CH1 may include a first channel layer 14 and may further include at least one of a first memory layer 13 and a first gap-filling layer 15.

Each of the first channel layers 14 may be a region where a channel of a select transistor, a memory cell, or a dummy memory cell is formed. The first channel layer 14 may include a semiconductor material, such as silicon or germanium, or a nanostructure, such as nanodots, nanotubes, or graphene. The first memory layer 13 may include at least one of a blocking layer, a data storage layer, and a tunnel insulating layer. The tunnel insulating layer may be a layer where charges are tunneled by Fowler-Nordheim (F-N) tunneling, and may include an insulating material, such as oxides or nitrides. The data storage layer may serve as actual data storage and include a floating gate, a charge trapping material, polysilicon, a nitride, a variable resistance material, a phase change material, or a nanostructure. The blocking layer may prevent movements of charges to the first conductive layer 11 and include a high-k dielectric material such as aluminum oxide $Al_2O_3$. The first gap-filling layer 15 may be formed in the first channel layer 14 and include an insulating material such as an oxide.

The second stacked structure ST2 may include second conductive layers 21 and second insulating layers 22 stacked alternately with each other. Each of the second conductive layers 21 may be a gate electrode of a select transistor, a memory cell, or a dummy transistor. The second conductive layers 21 may include a conductive material such as polysilicon, tungsten, and metal. The second insulating layers 22 may be formed to insulate the stacked second conductive layers 21 from each other. The second insulating layers 22 may include an insulating material such as oxides and nitrides. The second conductive layers 21 may include at least one source select line, word lines, and at least one drain select line. The second conductive layers 21 may further include at least one drain side dummy word line or at least one source side dummy word line.

A second channel structure CH2 may pass through the second stacked structure ST2 and extend in the third direction III. The second channel structures CH2 may be coupled to the second bit lines 26. Select transistors, memory cells, or dummy memory cells may be located at intersections between the second channel structure CH2 and the second conductive layers 21. The second channel structure CH2 may include a second channel layer 24 and may further include at least one of a second memory layer 23 and a second gap-filling layer 25.

The second channel layer 24 may be a region where a channel of a select transistor or a memory cell is formed. The second channel layer 24 may include a semiconductor material, such as silicon or germanium, or a nanostructure, such as nanodots, nanotubes, or graphene. The second memory layer 23 may include at least one of a blocking layer, a data storage layer, and a tunnel insulating layer. The tunnel insulating layer may be a layer where charges are tunneled by Fowler-Nordheim (F-N) tunneling, and may include an insulating material, such as oxides or nitrides. The data storage layer may serve as actual data storage, and may include a floating gate, a charge trapping material, polysilicon, a nitride, a variable resistance material, a phase change material, or a nanostructure. The blocking layer may prevent movements of charges to the second conductive layer 21 and include a high-k dielectric material such as aluminum oxide $Al_2O_3$. The second gap-filling layer 25 may be formed in the second channel layer 24 and include an insulating material such as an oxide.

The common source line 30 may be located between the first stacked structure ST1 and the second stacked structure ST2. The first memory block MB1 and the second memory block MB2 may share the common source line 30. The first channel layer 14 and the second channel layer 24 may be coupled to the common source line 30. The first channel layer 14 and the second channel layer 24 may protrude into the common source line 30. Alternatively, the first channel layer 14 and the second channel layer 24 may be coupled to the common source line 30 through a selectively grown silicon layer.

The first memory block MB1 and the second memory block MB2 may have a symmetrical structure with respect to the common source line 30. The first stacked structure ST1, the first channel structure CH1, and the first bit lines 16 may be arranged in mirror type with the second stacked structure ST2, the second channel structure CH2, and the second bit lines 26.

Figure 5:
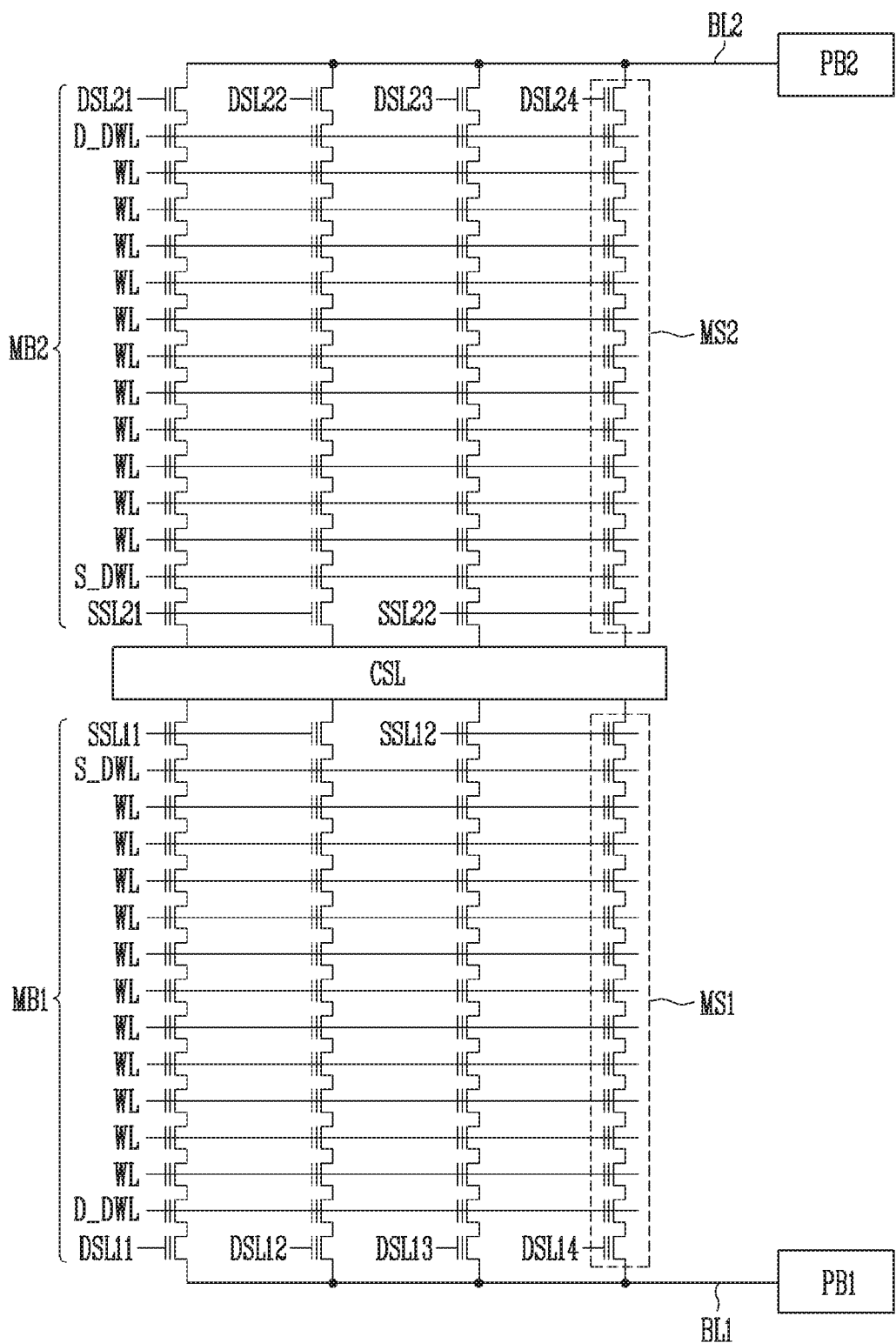
FIG. 5 is a diagram illustrating a method of operating a semiconductor device according to an embodiment of the present disclosure.

FIG. 5 is a diagram illustrating a method of operating a semiconductor device according to an embodiment of the present disclosure. In the following description, descriptions of certain elements that are discussed above are omitted for the sake of brevity.

Referring to FIG. 5, a semiconductor device may include the first memory block MB1, the second memory block MB2, the common source line CSL, a first bit line BL1, a second bit line BL2, a first page buffer PB1, and a second page buffer PB2.

The first memory block MB1 may include first memory strings MS1. The first memory strings MS1 may be coupled between the common source line CSL and the first bit line BL1.

The second memory block MB2 may include second memory strings MS2. The second memory strings MS2 may be coupled between the common source line CSL and the second bit line BL2. The first memory strings MS1 and the second memory strings MS2 may be located at different levels. The first bit line BL1 and the second bit line BL2 may be located at different levels.

The common source line CSL may be coupled commonly to the first memory block MB1 and the second memory block MB2. The common source line CSL may be located between the first memory block MB1 and the second memory block MB2.

Connections between the first memory strings MS1 and the common source line CSL may be controlled by first source lines SSL11 and SSL12. Connections between the second memory strings MS2 and the common source line CSL may be controlled by second source lines SSL21 and SSL22.

The first memory strings MS1 may be coupled to the first bit line BL1. Connections between the first memory strings MS1 and the first bit line BL1 may be controlled by a bias applied to first drain select lines DSL11 to DSL14. The second memory strings MS2 may be coupled to the second bit line BL2. Connections between the second memory strings MS2 and the second bit line BL2 may be controlled by a bias applied to second drain select lines DSL21 to DSL24.

The first page buffer PB1 may access the first memory strings MS1 through the first bit line BL1. The second page buffer PB2 may access the second memory strings MS2 through the second bit line BL2.

During a program, read, or erase operation, one of the first and second memory blocks MB1 and MB2 may be selected. When the first memory block MB1 is selected, the first bit line BL1 may be electrically connected to the first page buffer PB1, and the second bit line BL2 may be electrically disconnected from the second page buffer PB2. When the second memory block MB2 is selected, the second bit line BL2 may be electrically connected to the second page buffer PB2, and the first bit line BL1 may be electrically disconnected from the first page buffer PB1.

According to the above-described configuration, the first and second memory blocks MB1 and MB2 sharing the common source line CSL may be coupled to the first and second page buffers PB1 and PB2, respectively. Therefore, the first page buffer PB1 may be coupled to the first bit line BL1 to sense a cell array of the first memory block MB1, and the second page buffer PB2 may be coupled to the second bit line BL2 to sense a cell array of the second memory block MB2.

Figure 6:
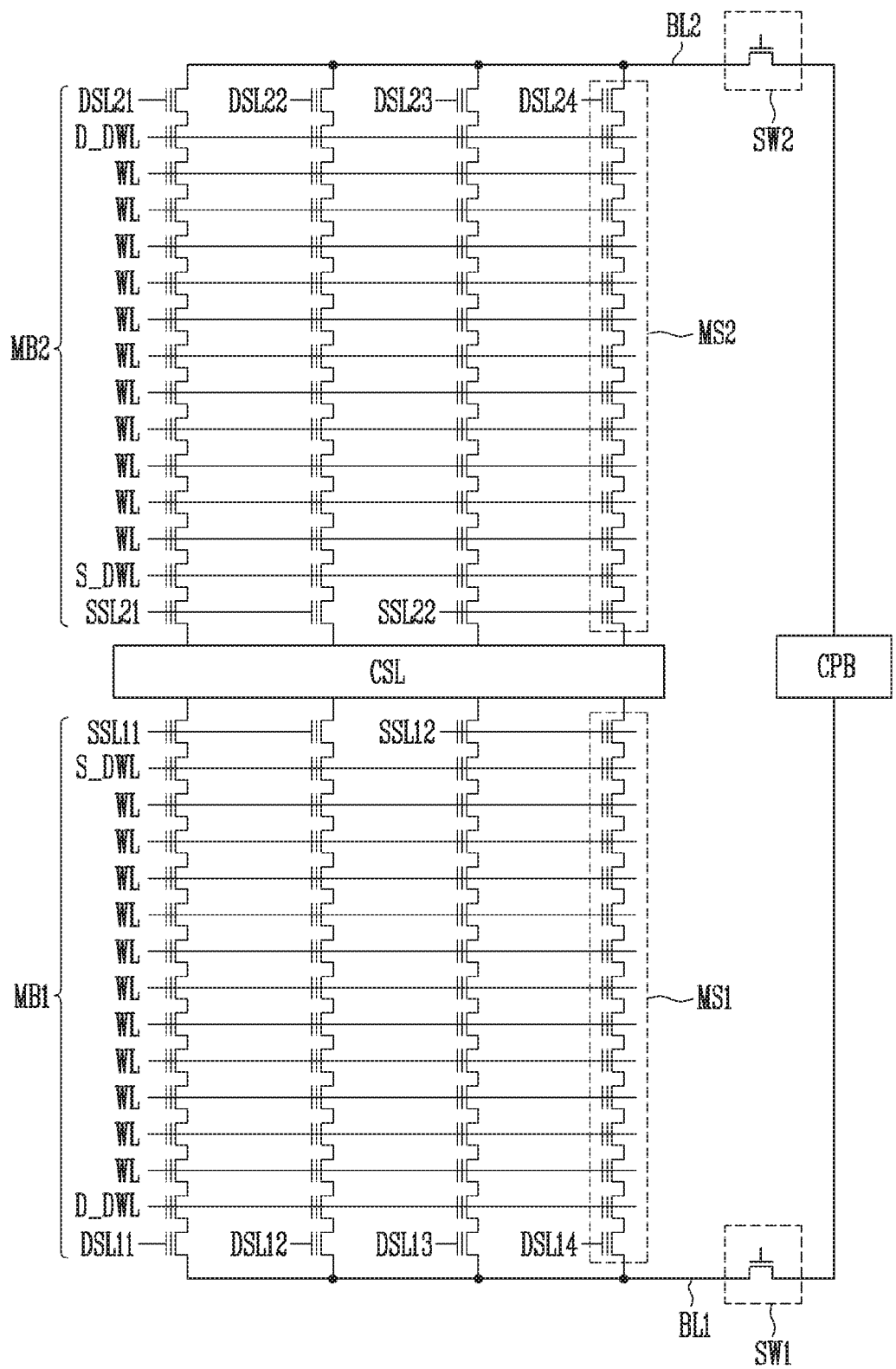
FIG. 6 is a diagram illustrating a method of operating a semiconductor device according to an embodiment of the present disclosure.

FIG. 6 is a diagram illustrating a method of operating a semiconductor device according to an embodiment of the present disclosure. In the following description, descriptions of certain elements that are discussed above are omitted for the sake of brevity.

Referring to FIG. 6, a semiconductor device may include the first memory block MB1, the second memory block MB2, the common source line CSL, the first bit line BL1, the second bit line BL2, a common page buffer CPB, a first switch SW1, and a second switch SW2.

The common page buffer CPB may be coupled commonly to the first memory block MB1 and the second memory block MB2. In other words, the first memory block MB1 and the second memory block MB2 may share the common page buffer CPB. The common page buffer CPB may access the first memory string MS1 through the first bit line BL1, or may access the second memory string MS2 through the second bit line BL2.

Connections between the first and second memory blocks MB1 and MB2 and the common page buffer CPB may be controlled by the first and second switches SW1 and SW2. The first switch SW1 may be coupled between the first bit line BL1 and the common page buffer CPB. The first switch SW1 may include at least one transistor and be turned on or off in response to a block selection signal. The connection between the first bit line BL1 and the common page buffer CPB may be controlled by the first switch SW1. The second switch SW2 may be coupled between the second bit line BL2 and the common page buffer CPB. The second switch SW2 may include at least one transistor and be turned on or off in response to a block selection signal. Connection between the second bit line BL2 and the common page buffer CPB may be controlled by the second switch SW2.

During a program, read, or erase operation, one of the first and second memory blocks MB1 and MB2 may be selected. When the first memory block MB1 is selected, the first switch SW1 may be turned on and the second switch SW2 may be turned off. When the first switch SW1 is turned on, the first bit line BL1 and the common page buffer CPB may be electrically connected to each other. When the second switch SW2 is turned off, the second bit line BL2 and the common page buffer CPB may be electrically disconnected from each other. Therefore, when the first memory block MB1 is selected, the common page buffer CPB may access the first memory string MS1 through the first bit line BL1 and may not access the second memory string MS2.

When the second memory block MB2 is selected, the second switch SW2 may be turned on and the first switch SW1 may be turned off. When the second switch SW2 is turned on, the second bit line BL2 and the common page buffer CPB may be electrically connected to each other. When the first switch SW1 is turned off, the first bit line BL1 and the common page buffer CPB may be electrically disconnected from each other. Therefore, when the second memory block MB2 is selected, the common page buffer CPB may access the second memory string MS2 through the second bit line BL2 and may not access the first memory string MS1.

According to the above-described configuration, the first and second memory blocks MB1 and MB2 sharing the common source line CSL may share the common page buffer CPB. In addition, the connections between the common page buffer CPB and the first and second memory blocks MB1 and MB2 may be controlled by the first switch SW1 and the second switch SW2. Therefore, the common page buffer CPB may not be simultaneously coupled to the first and second memory blocks MB1 and MB2 and may access only the selected memory block.

Figure 7:
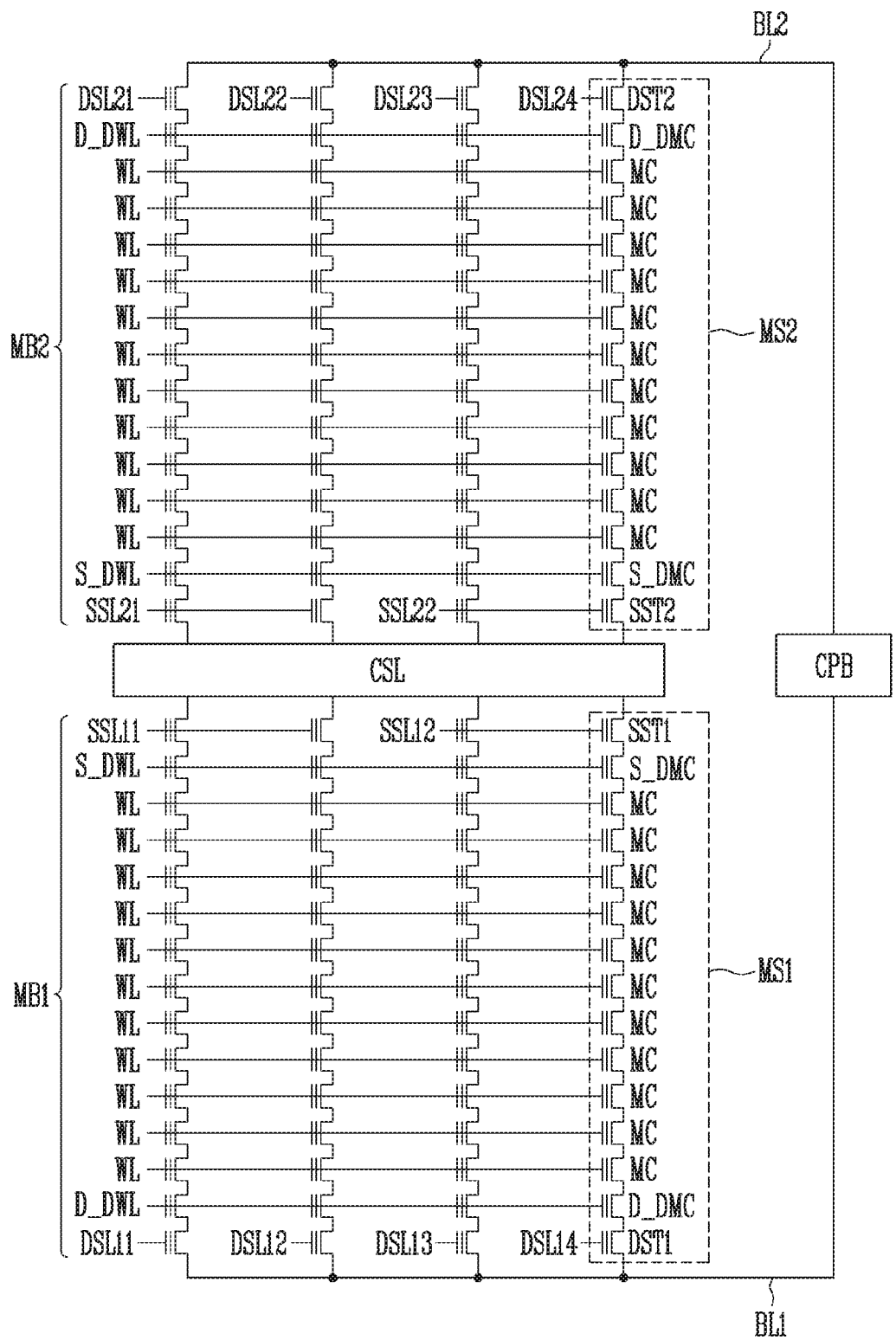
FIG. 7 is a diagram illustrating a method of operating a semiconductor device according to an embodiment of the present disclosure.

FIG. 7 is a diagram illustrating a method of operating a semiconductor device according to an embodiment of the present disclosure. In the following description, descriptions of certain elements that are discussed above are omitted for the sake of brevity.

Referring to FIG. 7, a semiconductor device may include the first memory block MB1, the second memory block MB2, the common source line CSL, the first bit line BL1, the second bit line BL2, and the common page buffer CPB.

The first memory string MS1 may include at least one first drain select transistor DST1, at least one drain side dummy memory cell D_DMC, memory cells MC, at least one source side dummy memory cell S_DMC, and at least one first source select transistor SST1. The second memory string MS2 may include at least one second drain select transistor DST2, at least one drain side dummy memory cell D_DMC, the memory cells MC, the source side dummy memory cell S_DMC, and at least one second source select transistor SST2.

The connections between the first memory strings MS1 and the first bit line BL1 may be controlled by the first drain select transistor DST1. The connections between the second memory strings MS2 and the second bit line BL2 may be controlled by the second drain select transistor DST2.

The common page buffer CPB may be coupled commonly to the first memory block MB1 and the second memory block MB2. The common page buffer CPB may access the first memory string MS1 through the first bit line BL1 and the second memory string MS2 through the second bit line BL2.

Connections between the first and second memory blocks MB1 and MB2 and the common page buffer CPB may be controlled by the first and second drain select lines DSL11 to DSL14 and DSL21 to DSL24. The connections between the first memory strings MS1 and the common page buffer CPB may be controlled by the first drain select transistor DST1. The connections between the second memory strings MS2 and the common page buffer CPB may be controlled by the second drain select transistor DST2.

During a program, read, or erase operation, one of the first and second memory blocks MB1 and MB2 may be selected. When the first memory block MB1 is selected, the first drain select transistors DST1 of the selected first memory strings MS1 may be turned on and the second drain select transistors DST2 of the second memory strings MS2 may be turned off. When the first drain select transistors DST1 are turned on, the common page buffer CPB may access the first memory strings MS1 through the first bit line BL1. When the second drain select transistors DST2 are turned off, the common page buffer CPB may not access the second memory strings MS2. The first drain select transistors DST1 of the first memory strings MS1 which are program-inhibited, among the first memory strings MS1, may be turned off. Therefore, even when the first memory block MB1 is selected, the common page buffer CPB may not access the program-inhibited first memory strings MS1.

When the second memory block MB2 is selected, the second drain select transistors DST2 of the selected second memory strings MS2 may be turned on and the first drain select transistors DST1 of the first memory strings MS1 may be turned off. When the second drain select transistors DST2 are turned on, the common page buffer CPB may access the second memory strings MS2 through the second bit line BL2. When the first drain select transistors DST1 are turned off, the common page buffer CPB may not access the first memory strings MS1. The first drain select transistors DST2 of the second memory strings MS2 which are program-inhibited, among the second memory strings MS2, may be turned off. Therefore, even when the second memory block MB2 is selected, the common page buffer CPB may not access the program-inhibited second memory strings MS2.

According to the above-described configuration, the first and second memory blocks MB1 and MB2 sharing the common source line CSL may share the common page buffer CPB. In addition, although a separate switch is not provided, connections between the common page buffer CPB and the first and second memory blocks MB1 and MB2 may be controlled using the first drain select transistor DST1 and the second drain select transistor DST2.

Figure 8:
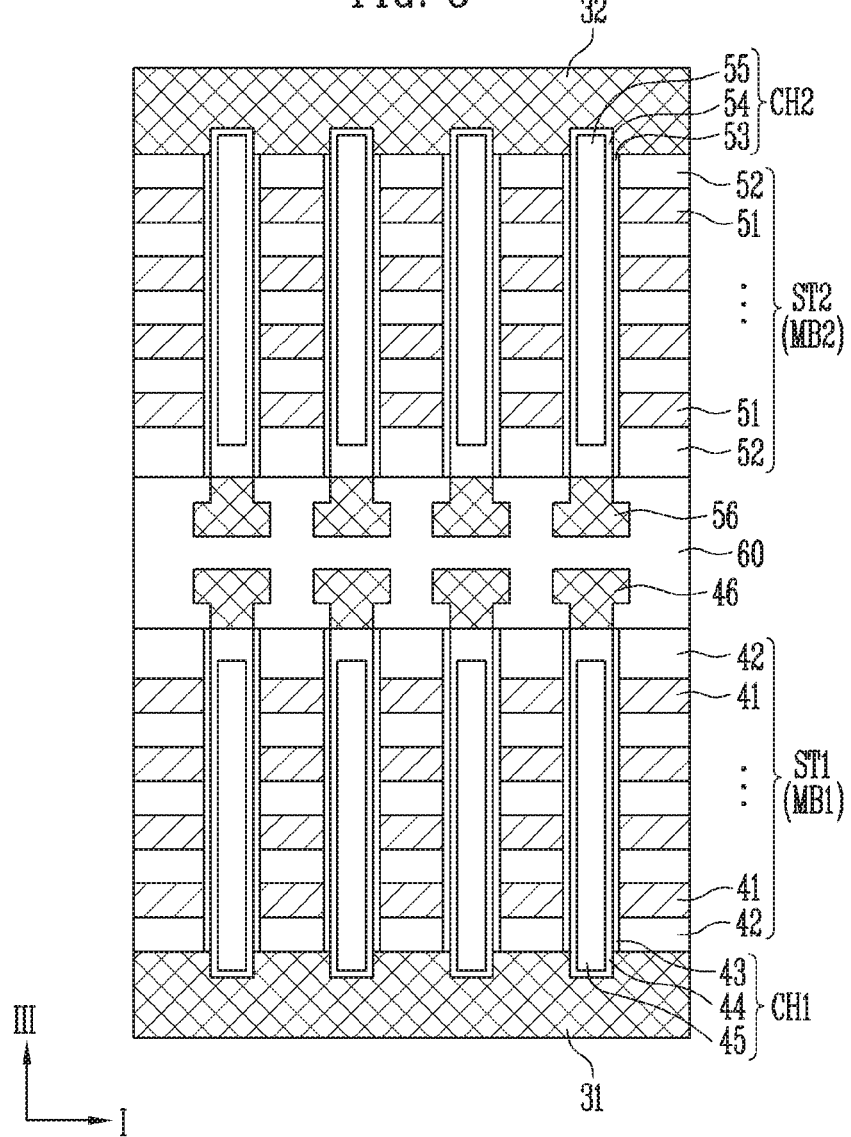
FIG. 8 is a diagram illustrating a configuration of a semiconductor device according to an embodiment of the present disclosure.

FIG. 8 is a diagram illustrating the configuration of a semiconductor device according to an embodiment of the present disclosure. In the following description, descriptions of certain elements that are discussed above are omitted for the sake of brevity.

Referring to FIG. 8, the semiconductor device may include the first stacked structure ST1, the second stacked structure ST2, a first source line 31, a second source line 32, first bit lines 46, and second bit lines 56. The first stacked structure ST1 may belong to the first memory block MB1 and the second stacked structure ST2 may belong to the second memory block MB2. The first stacked structure ST1 and the second stacked structure ST2 may be stacked in the third direction III.

The first stacked structure ST1 may include first conductive layers 41 and first insulating layers 42 stacked alternately with each other. The first channel structure CH1 may include a first channel layer 44 and may further include at least one of a first memory layer 43 and a first gap-filling layer 45. The second stacked structure ST2 may include second conductive layers 51 and second insulating layers 52 stacked alternately with each other. The second channel structure CH2 may include a second channel layer 54 and may further include at least one of the second memory layer 53 and a second gap-filling layer 55.

The first channel layer 44 may be coupled to the first source line 31 and the second channel layer 54 may be coupled to the second source line 32. The first channel layer 44 may protrude into the first source line 31 and the second channel layer 54 may protrude into the second source line 32.

Alternatively, the first channel layer 44 may be coupled to the first source line 31 through a selectively grown silicon layer, and the second channel layer 54 may be coupled to the second source line 32 through a selectively grown silicon layer.

The first bit lines 46 and the second bit lines 56 may be located between the first stacked structure ST1 and the second stacked structure ST2. An insulating layer 60 may be located between the first stacked structure ST1 and the second stacked structure ST2, and the first bit lines 46 and the second bit lines 56 may be located in the insulating layer 60. The first bit lines 46 and the second bit lines 56 may be located at the same level, or different levels in the insulating layer 60.

The first source line 31 may be located under the first stacked structure ST1 and the second source line 32 may be located above the second stacked structure ST2. The first source line 31, the first stacked structure ST1, the insulating layer 60, the second stacked structure ST2, and the second source line 32 may be sequentially stacked in the third direction III.

The first memory block MB1 and the second memory block MB2 may have a symmetrical structure with respect to the insulating layer 60. The first stacked structure ST1, the first channel structure CH1 and the first source line 31 may be arranged in mirror type with the second stacked structure ST2, the second channel structure CH2 and the second source line 32.

FIG. 9 is a diagram illustrating a method of operating a semiconductor device according to an embodiment of the present disclosure. In the following description, descriptions of certain elements that are discussed above are omitted for the sake of brevity.

Referring to FIG. 9, a semiconductor device may include the first memory block MB1, the second memory block MB2, the first source line SL1, the second source line SL2, the first bit line BL1, the second bit line BL2, the first page buffer PB1, and the second page buffer PB2.

The first memory block MB1 may include the first memory strings MS1. The second memory block MB2 may include the second memory strings MS2. The first source line SL1 may be coupled to the first memory block MB1. The second source line SL2 may be coupled to the second memory block MB2. The first bit line BL1 and the second bit line BL2 may be located between the first memory block MB1 and the second memory block MB2. The first bit line BL1 may be coupled to the first memory string MS1. The second bit line BL2 may be coupled to the second memory string MS2.

The first page buffer PB1 may access the first memory strings MS1 through the first bit line BL1. The second page buffer PB2 may access the second memory strings MS2 through the second bit line BL2.

During a program, read, or erase operation, one of the first and second memory blocks MB1 and MB2 may be selected. When the first memory block MB1 is selected, the first bit line BL1 may be electrically connected to the first page buffer PB1, and the second bit line BL2 may be electrically disconnected from the second page buffer PB2. When the second memory block MB2 is selected, the second bit line BL2 may be electrically connected to the second page buffer PB2, and the first bit line BL1 may be electrically disconnected from the first page buffer PB1.

According to the above-described configuration, the stacked first and second memory blocks MB1 and MB2 may be coupled to the first and second page buffers PB1 and PB2, respectively. Therefore, the first page buffer PB1 is coupled to the first bit line BL1 to sense a cell array of the first memory block MB1, and the second page buffer PB2 may be coupled to the second bit line BL2 to sense a cell array of the second memory block MB2.

Figure 10:
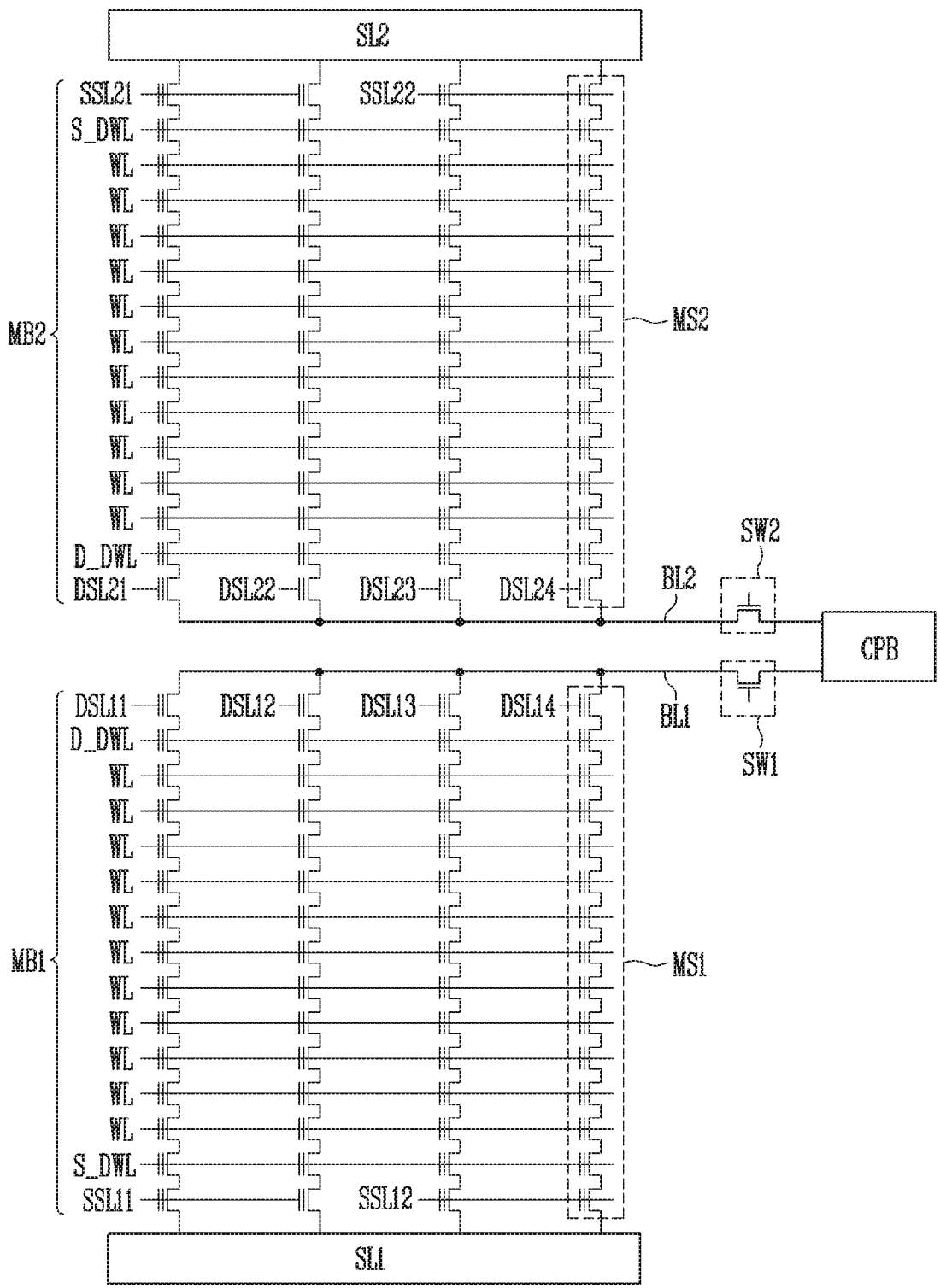
FIG. 10 is a diagram illustrating a method of operating a semiconductor device according to an embodiment of the present disclosure.

FIG. 10 is a diagram illustrating a method of operating a semiconductor device according to an embodiment of the present disclosure. In the following description, descriptions of certain elements that are discussed above are omitted for the sake of brevity.

Referring to FIG. 10, a semiconductor device may include the first memory block MB1, the second memory block MB2, the first source line SL1, the second source line SL2, the first bit line BL1, the second bit line BL2, the common page buffer CPB, the first switch SW1, and the second switch SW2.

The common page buffer CPB may be coupled commonly to the first memory block MB1 and the second memory block MB2. The common page buffer CPB may access the first memory string MS1 through the first bit line BL1 and the second memory string MS2 through the second bit line BL2.

The first switch SW1 may be coupled between the first bit line BL1 and the common page buffer CPB. The connection between the first bit line BL1 and the common page buffer CPB may be controlled by the first switch SW1. The second switch SW2 may be coupled between the second bit line BL2 and the common page buffer CPB. The connection between the second bit line BL2 and the common page buffer CPB may be controlled by the second switch SW2.

When the first memory block MB1 is selected, the first switch SW1 may be turned on and the second switch SW2 may be turned off. When the first switch SW1 is turned on, the first bit line BL1 and the common page buffer CPB may be electrically connected to each other. When the second switch SW2 is turned off, the second bit line BL2 and the common page buffer CPB may be electrically disconnected from each other. Therefore, when the first memory block MB1 is selected, the common page buffer CPB may access the first memory string MS1 through the first bit line BL1 and may not access the second memory string MS2.

When the second memory block MB2 is selected, the second switch SW2 may be turned on and the first switch SW1 may be turned off. When the second switch SW2 is turned on, the second bit line BL2 and the common page buffer CPB may be electrically connected to each other. When the first switch SW1 is turned off, the first bit line BL1 and the common page buffer CPB may be electrically disconnected from each other. Therefore, when the second memory block MB2 is selected, the common page buffer CPB may access the second memory string MS2 through the second bit line BL2 and may not access the first memory string MS1.

According to the above-described configuration, the stacked first and second memory blocks MB1 and MB2 may share the common page buffer CPB. In addition, the connections between the common page buffer CPB and the first and second memory blocks MB1 and MB2 may be controlled by the first switch SW1 and the second switch SW2. Therefore, the common page buffer CPB may not be simultaneously coupled to the first and second memory blocks MB1 and MB2 and access only the selected memory block.

Figure 11:
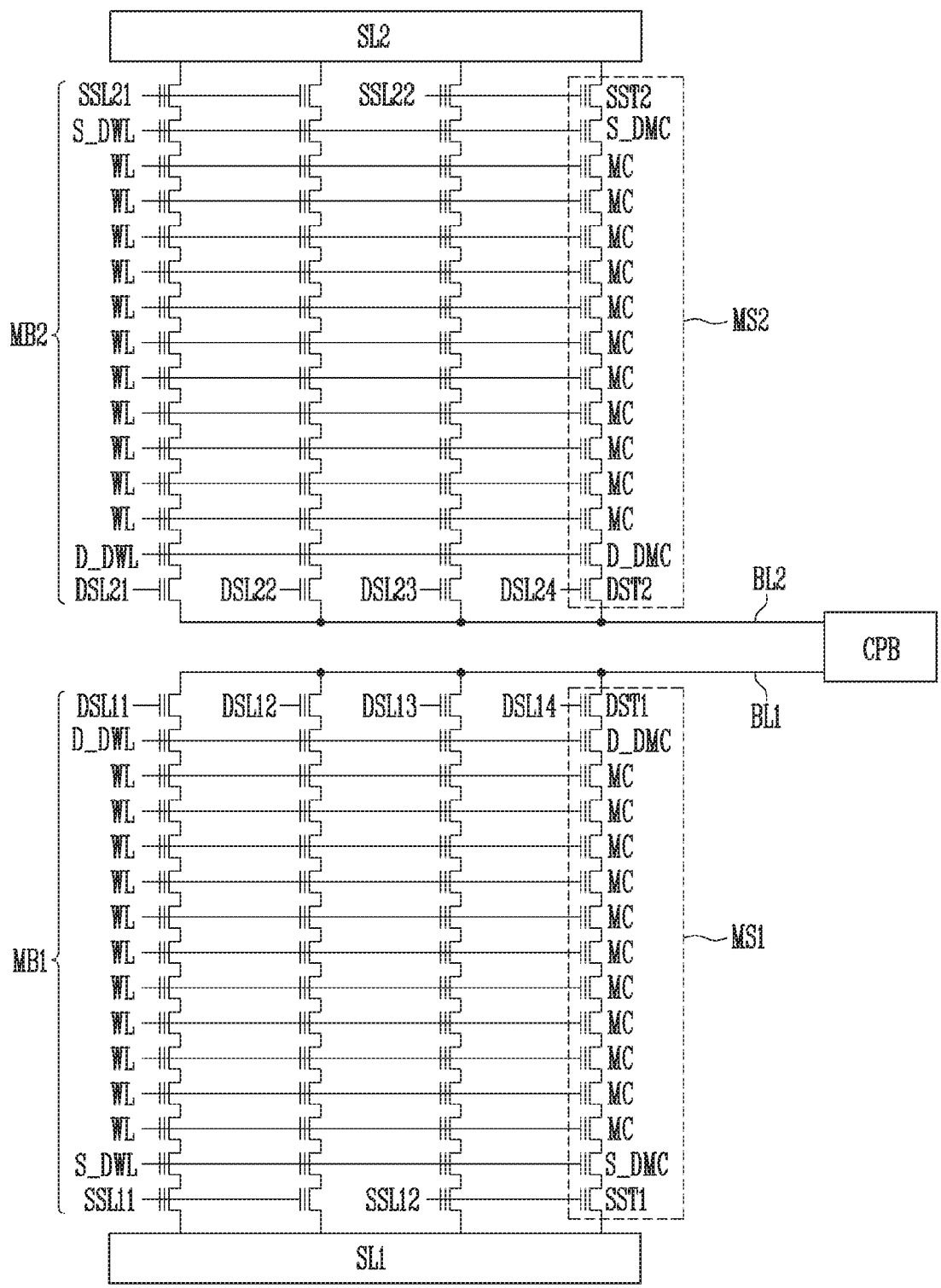
FIG. 11 is a diagram illustrating a method of operating a semiconductor device according to an embodiment of the present disclosure.

FIG. 11 is a diagram illustrating a method of operating a semiconductor device according to an embodiment of the present disclosure. In the following description, descriptions of certain elements that are discussed above are omitted for the sake of brevity.

Referring to FIG. 11, a semiconductor device may include the first memory block MB1, the second memory block MB2, the first source line SL1, the second source line SL2, the first bit line BL1, the second bit line BL2, and the common page buffer CPB.

The connections between the first memory strings MS1 and the first bit line BL1 may be controlled by the first drain select transistor DST1. The connections between the second memory strings MS2 and the second bit line BL2 may be controlled by the second drain select transistor DST2.

The common page buffer CPB may be coupled commonly to the first memory block MB1 and the second memory block MB2. The common page buffer CPB may access the first memory string MS1 through the first bit line BL1 and the second memory string MS2 through the second bit line BL2.

The connections between the first memory strings MS1 and the common page buffer CPB may be controlled by the first drain select transistor DST1. The connections between the second memory strings MS2 and the common page buffer CPB may be controlled by the second drain select transistor DST2.

When the first memory block MB1 is selected, the first drain select transistors DST1 of the selected first memory strings MS1 may be turned on and the second drain select transistors DST2 of the second memory strings MS2 may be turned off. When the first drain select transistors DST1 are turned on, the common page buffer CPB may access the first memory strings MS1 through the first bit line BL1. When the second drain select transistors DST2 are turned off, the common page buffer CPB may not access the second memory strings MS2. The first drain select transistors DST1 of the first memory strings MS1 which are program-inhibited, among the first memory strings MS1, may be turned off. Therefore, even when the first memory block MB1 is selected, the common page buffer CPB may not access the program-inhibited first memory strings MS1.

When the second memory block MB2 is selected, the second drain select transistors DST2 of the selected second memory strings MS2 may be turned on and the first drain select transistors DST1 of the first memory strings MS1 may be turned off. When the second drain select transistors DST2 are turned on, the common page buffer CPB may access the second memory strings MS2 through the second bit line BL2. When the first drain select transistors DST1 are turned off, the common page buffer CPB may not access the first memory strings MS1. The first drain select transistors DST2 of the second memory strings MS2 which are program-inhibited, among the second memory strings MS2, may be turned off. Therefore, even when the second memory block MB2 is selected, the common page buffer CPB may not access the program-inhibited second memory strings MS2.

According to the above-described configuration, the stacked first and second memory blocks MB1 and MB2 may share the common page buffer CPB. In addition, although a separate switch is not provided, connections between the common page buffer CPB and the first and second memory blocks MB1 and MB2 may be controlled using the first drain select transistor DST1 and the second drain select transistor DST2.

Figure 12:
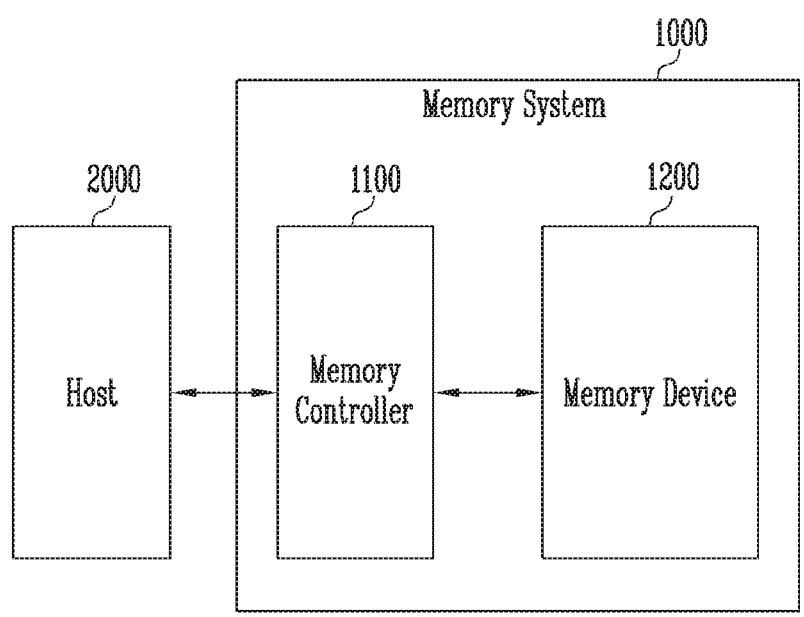
FIG. 12 is a diagram illustrating a memory system according to an embodiment of the present disclosure.

FIG. 12 is a diagram illustrating a memory system 1000 according to an embodiment of the present disclosure.

Referring to FIG. 12, the memory system 1000 may include a memory device 1200 configured to store data and a controller 1100 performing communications between the memory device 1200 and a host 2000.

The host 2000 may be a device or system configured to store data in the memory system 1000 or retrieve data from the memory system 1000. The host 2000 may generate requests RQ for various operations and output the generated requests RQ to the memory system 1000. The requests RQ may include a program request for a program operation, a read request for a read operation, and an erase request for an erase operation. The host 2000 may communicate with the host 2000 by using at least one interface protocol among a Non-Volatile Memory express (NVMe), a Peripheral Component Interconnect-Express (PCI-E), an Advanced Technology Attachment (ATA), a Serial ATA (SATA), a Parallel ATA (PATA), a Universal Serial Bus (USB), a Multi-Media Card (MMC), an Enhanced Small Disk Interface (ESDI), an Integrated Drive Electronics (IDE), a Mobile Industry Processor Interface (MIPI), a Universal Flash Storage (UFS), a Small Computer Small Interface (SCSI), and a Serial Attached SCSI (SAS).

The host 2000 may include at least one of a computer, a portable digital device, a tablet, a digital camera, a digital audio player, a television, a wireless communication device, or a cellular phone. However, embodiments of the disclosed technology are not limited thereto.

The controller 1100 may control overall operations of the memory system 1000. The controller 1100 may control the memory device 1200 in response to the requests RQ of the host 2000. The controller 1100 may control the memory device 1200 to perform a program operation, a read operation and an erase operation at the request of the host 2000. Alternatively, the controller 1100 may perform a background operation for performance improvement of the memory system 1000 in the absence of the request from the host 2000.

To control the operations of the memory device 1200, the controller 1100 may transfer a control signal CTRL and a data signal DQ to the memory device 1200. The control signal CTRL and the data signal DQ may be transferred to the memory device 1200 through different input/output lines. The data signal DQ may include a command CMD, an address ADD, or data DATA. The control signal CTRL may be used to differentiate periods where the data signal DQ is input.

The memory device 1200 may perform a program operation, a read operation and an erase operation in response to control of the controller 1100. The memory device 1200 may be a volatile memory that loses data when power supply is blocked, or a non-volatile memory that retains data in the absence of power supply. According to an embodiment, the memory device 1200 may be the above-descried semiconductor device 100, which may be a flash memory device.

At the request for a program, read, or erase operation from the host 2000, the controller 1100 may command the memory device 1200 to perform a program, read, or erase operation so as to select a memory block according to the method as described above with reference to FIGS. 1 to 11.

Figure 13:
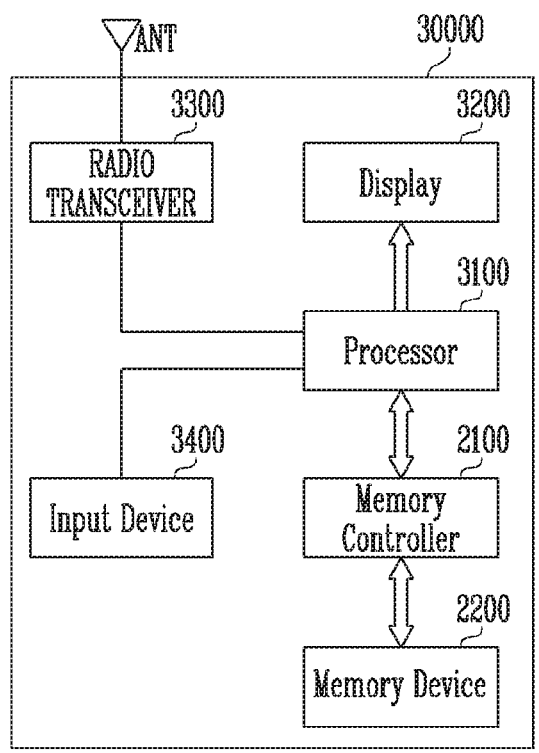
FIG. 13 is a diagram illustrating a memory system according to an embodiment of the present disclosure.

FIG. 13 is a diagram illustrating a memory system 30000 according to an embodiment.

Referring to FIG. 13, the memory system 30000 may be embodied into a cellular phone, a smart phone, a tablet, a personal computer (PC), a personal digital assistant (PDA), or a wireless communication device. The memory system 30000 may include a memory device 2200 and a controller 2100 controlling the operations of the memory device 2200.

The controller 2100 may control a data access operation of the memory device 2200, for example, a program operation, an erase operation or a read operation of the memory device 2200 in response to control of a processor 3100.

The controller 2100 may control data programmed into the memory device 2200 to be output through a display 3200 in response to control of the controller 2100.

A radio transceiver 3300 may exchange a radio signal through an antenna ANT. For example, the radio transceiver 3300 may change the radio signal received through the antenna ANT into a signal which can be processed by the processor 3100. Therefore, the processor 3100 may process the signal output from the radio transceiver 3300 and transfer the processed signal to the controller 2100 or the display 3200. The controller 2100 may transfer the signal processed by the processor 3100 into the memory device 2200. In addition, the radio transceiver 3300 may change a signal output from the processor 3100 into a radio signal and output the radio signal to an external device through the antenna ANT. A control signal for controlling the operations of the host or data to be processed by the processor 3100 may be input by an input device 3400, and the input device 3400 may include a pointing device, such as a touch pad and a computer mouse, a keypad, or a keyboard. The processor 3100 may control the operations of the display 3200 so that data output from the memory controller 1200, data output from the radio transceiver 3300, or data output from an input device 3400 may be output through the display 3200.

According to an embodiment, the controller 2100 capable of controlling the operations of the memory device 2200 may be realized as a portion of the processor 3100, or as a separate chip from the processor 3100.

Figure 14:
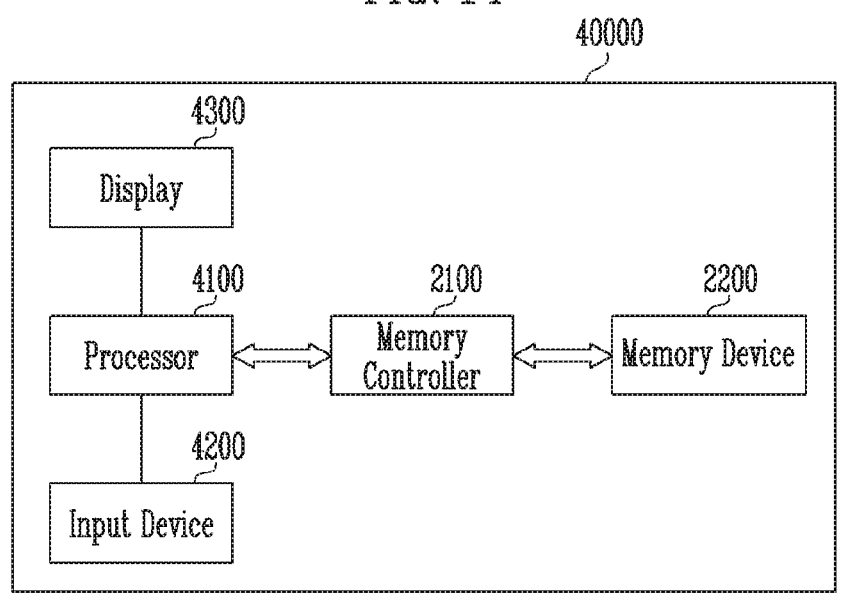
FIG. 14 is a diagram illustrating a memory system according to an embodiment of the present disclosure.

FIG. 14 is a diagram illustrating another embodiment of a memory system 40000.

Referring to FIG. 14, the memory system 40000 may be embodied into a personal computer (PC), a tablet PC, a net-book, an e-reader, a personal digital assistant (PDA), a portable multimedia player (PMP), an MP3 player, or an MP4 player.

The memory system 40000 may include the memory device 2200 and the controller 2100 controlling a data processing operation of the memory device 2200.

A processor 4100 may output data stored in the memory device 2200 through a display 4300 according to data input through an input device 4200. Examples of the input device 4200 may include a pointing device such as a touch pad or a computer mouse, a keypad, or a keyboard.

The processor 4100 may control overall operations of the memory system 40000 and control operations of the memory controller 2100. According to an embodiment, the memory device 2200 may be the above-descried semiconductor device 100, which may be a flash memory device.

Figure 15:
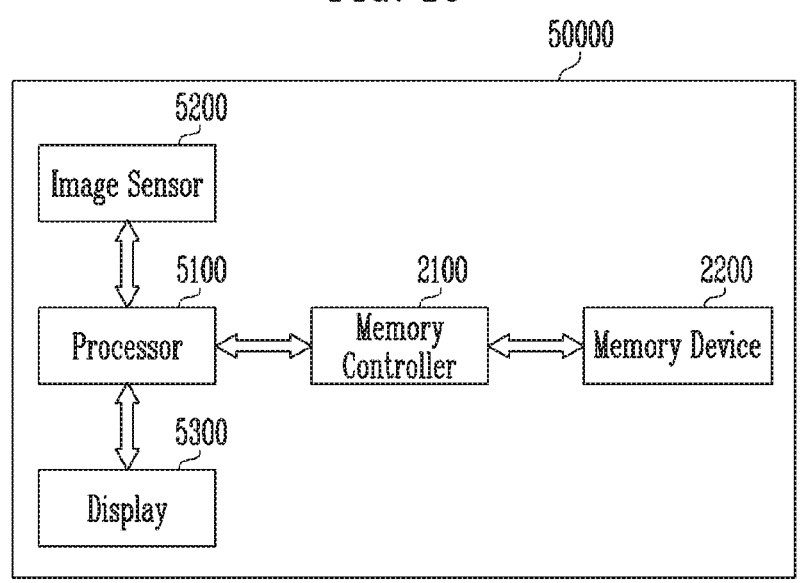
FIG. 15 is a diagram illustrating a memory system according to an embodiment of the present disclosure.

FIG. 15 is a diagram illustrating a memory system 50000 according to an embodiment of the present disclosure.

Referring to FIG. 15, the memory system 50000 may be embodied into an image processor, for example, a digital camera, a cellular phone with a digital camera attached thereto, a smart phone with a digital camera attached thereto, or a table PC with a digital camera attached thereto.

The memory system 50000 may include the memory device 2200 and the controller 2100 controlling a data processing operation of the memory device 2200, for example, a program operation, an erase operation, or a read operation.

An image sensor 5200 of the memory system 50000 may convert an optical image into digital signals. The converted digital signals may be transferred to a processor 5100 or the controller 2100. In response to control of the processor 5100, the converted digital signals may be output through the display 5300 or stored in the memory device 2200 through the controller 2100. In addition, the data stored in the memory device 2200 may be output through a display 5300 according to control of the processor 5100 or the controller 2100.

According to an embodiment, the controller 2100 for controlling the operations of the memory device 2200 may be formed as a part of the processor 5100, or a separate chip from the processor 5100.

Figure 16:
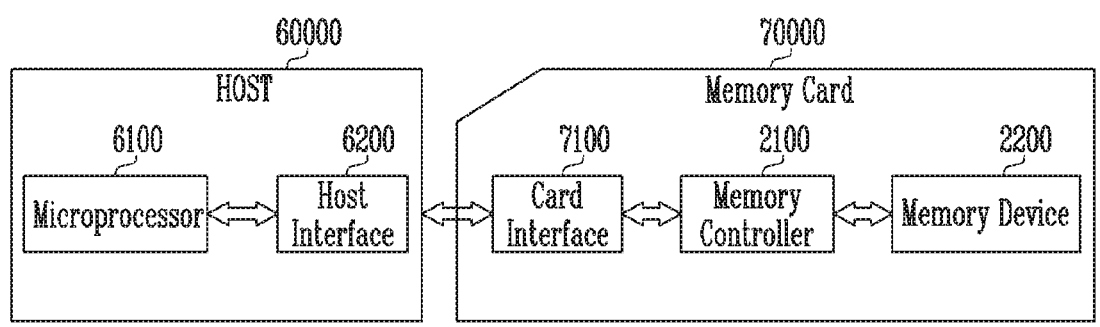
FIG. 16 is a diagram illustrating a memory system according to an embodiment of the present disclosure.

FIG. 16 is a diagram illustrating a memory system 70000 according to an embodiment of the present disclosure.

Referring to FIG. 16, the memory system 70000 may include a memory card or a smart card. The memory system 70000 may include the memory device 2200, the controller 2100, and a card interface 7100.

The controller 2100 may control data exchange between the memory device 2200 and the card interface 7100. According to an embodiment, the card interface 7100 may be, but not limited thereto, a secure digital (SD) card interface or a multi-media card (MMC) interface.

The card interface 7100 may interface data exchange between a host 60000 and the controller 2100 according to a protocol of the host 60000. According to an embodiment, the card interface 7100 may support a Universal Serial Bus (USB) protocol and an InterChip (IC)-USB protocol. The card interface 7100 may refer to hardware capable of supporting a protocol which is used by the host 60000, software installed in the hardware, or a signal transmission method.

When the memory system 70000 is connected to an host interface 6200 of the host 60000 such as a PC, a tablet PC, a digital camera, a digital audio player, a cellular phone, a console video game hardware, or a digital set-top pox, the host interface 6200 may perform data communication with the memory device 2200 through the card interface 7100 and the controller 2100 in response to control of a microprocessor 6100.

According to the present disclosure, a semiconductor device having improved operating characteristics and reliability may be provided.

It will be apparent to those skilled in the art that various modifications can be made to any of the above-described embodiments of the present invention without departing from the spirit or scope of the invention. Thus, it is intended that the present invention cover all such modifications provided they come within the scope of the appended claims and their equivalents.

What is claimed is:

1. A semiconductor device, comprising:
a first memory block including a first memory string;
a second memory block including a second memory string;
a common source line commonly coupled to the first memory block and the second memory block;
a first bit line coupled to the first memory string;
a second bit line coupled to the second memory string;
a first page buffer for accessing the first memory string through the first bit line; and
a second page buffer for accessing the second memory string through the second bit line,
wherein the first bit line and the first page buffer are electrically connected to each other when the first memory block is selected.

2. The semiconductor device of claim 1, wherein the second bit line and the second page buffer are electrically disconnected from each other when the first memory block is selected.

3. The semiconductor device of claim 1, wherein when the second memory block is selected, the second bit line is electrically connected to the second page buffer and the first bit line is electrically disconnected from the first page buffer.

4. The semiconductor device of claim 1, wherein the first memory string is coupled between the common source line and the first bit line and the second memory string is coupled between the common source line and the second bit line.

5. The semiconductor device of claim 4, wherein the first memory string and the second memory string are located at different levels.

6. The semiconductor device of claim 1, wherein the first bit line and the second bit line are located at different levels.

7. The semiconductor device of claim 1, wherein the second memory block is stacked on the first memory block.

8. The semiconductor device of claim 7, wherein the common source line is located between the first memory block and the second memory block.

9. A semiconductor device, comprising:
a first memory block including a first memory string including a first drain select transistor;
a second memory block including a second memory string including a second drain select transistor;
a common source line commonly coupled to the first memory block and the second memory block;
a first bit line, wherein a connection between the first bit line and the first memory string is controlled by the first drain select transistor;
a second bit line, wherein a connection between the second bit line and the second memory string is controlled by the second drain select transistor; and
a common page buffer for accessing the first memory string through the first bit line, or the second memory string through the second bit line,
wherein the common page buffer accesses the first memory string through the first bit line and does not access the second memory string when the first memory block is selected.

10. The semiconductor device of claim 9, wherein the common page buffer accesses the second memory string through the second bit line when the second memory block is selected.

11. The semiconductor device of claim 9, further comprising:
a first switch for controlling a connection between the first bit line and the common page buffer; and
a second switch for controlling a connection between the second bit line and the common page buffer.

12. The semiconductor device of claim 11, wherein the first switch is turned on and the second switch is turned off when the first memory block is selected.

13. The semiconductor device of claim 11, wherein the first switch is turned off and the second switch is turned on when the second memory block is selected.

14. The semiconductor device of claim 9, wherein the first drain select transistor is turned on and the second drain select transistor is turned off when the first memory block is selected.

15. The semiconductor device of claim 9, wherein when the second memory block is selected, the first drain select transistor is turned off and the second drain select transistor is turned on.

16. A semiconductor device, comprising:
- a first memory block including a first memory string;
- a second memory block including a second memory string;
- a first source line coupled to the first memory block;
- a second source line coupled to the second memory block;
- a first bit line located between the first memory block and the second memory block and coupled to the first memory string;
- a second bit line located between the first memory block and the second memory block and coupled to the second memory string;
- a first page buffer for accessing the first memory string through the first bit line; and
- a second page buffer for accessing the second memory string through the second bit line, wherein when the first memory block is selected, the first bit line is electrically connected to the first page buffer.

17. The semiconductor device of claim 16, wherein the second bit line and the second page buffer are electrically disconnected from each other when the first memory block is selected.

18. A semiconductor device, comprising:
- a first memory block including a first memory string including a first drain select transistor;
- a second memory block including a second memory string including a second drain select transistor;
- a first source line coupled to the first memory block;
- a second source line coupled to the second memory block;
- a first bit line located between the first memory block and the second memory block, wherein a connection between the first bit line and the first memory string is controlled by the first drain select transistor;
- a second bit line located between the first memory block and the second memory block, wherein a connection between the second bit line and the second memory string is controlled by the second drain select transistor; and
- a common page buffer for accessing the first memory string through the first bit line, or the second memory string through the second bit line,
wherein the common page buffer accesses the first memory string through the first bit line and does not access the second memory string when the first memory block is selected.

* * * * *